United States Patent
Yu et al.

(10) Patent No.: US 7,816,167 B2
(45) Date of Patent: Oct. 19, 2010

(54) METHOD OF FABRICATING A DIFFERENTIAL DOPED SOLAR CELL

(75) Inventors: Cheng-Yeh Yu, Guanyin Shiang (TW);
Ming-Chin Kuo, Guanyin Shiang (TW);
Nai-Tien Ou, Guanyin Shiang (TW);
Tien-Szu Chen, Guanyin Shiang (TW)

(73) Assignee: Gintech Energy Corporation, Miaoli County (TW)

( * ) Notice: Subject to any disclaimer, the term of this patent is extended or adjusted under 35 U.S.C. 154(b) by 0 days.

(21) Appl. No.: 12/368,707

(22) Filed: Feb. 10, 2009

(65) Prior Publication Data

US 2010/0068886 A1   Mar. 18, 2010

(30) Foreign Application Priority Data

Sep. 16, 2008   (TW) .............. 97135526 A

(51) Int. Cl.
*H01L 21/00*   (2006.01)
(52) U.S. Cl. .............. 438/57; 438/69; 438/72; 438/98; 257/E31.014
(58) Field of Classification Search ............ None
See application file for complete search history.

(56) References Cited

U.S. PATENT DOCUMENTS

| | | | | |
|---|---|---|---|---|
| 5,698,451 A | * | 12/1997 | Hanoka | 438/98 |
| 5,871,591 A | * | 2/1999 | Ruby et al. | 136/261 |
| 6,180,869 B1 | * | 1/2001 | Meier et al. | 136/256 |
| 6,262,359 B1 | * | 7/2001 | Meier et al. | 136/256 |

* cited by examiner

*Primary Examiner*—Zandra Smith
*Assistant Examiner*—Khanh B Duong
(74) *Attorney, Agent, or Firm*—Muncy, Geissler Olds, & Lowe, PLLC

(57) ABSTRACT

A method of fabricating a differential doped solar cell is described. The method includes the following steps. First, a substrate is provided. A doping process is conducted thereon to form a doped layer. A heavy doping portion of the doped layer is partially or fully removed. Subsequently, an anti-reflection coating layer is formed thereon. A metal conducting paste is printed on the anti-reflection coating layer and is fired to form the metal electrodes for the solar cell.

14 Claims, 4 Drawing Sheets

METHOD OF FABRICATING A DIFFERENTIAL DOPED SOLAR CELL

RELATED APPLICATIONS

This application claims priority to Taiwan Application Serial Number 97135526, filed Sep. 16, 2008, which is herein incorporated by reference.

FIELD OF THE INVENTION

The present invention generally relates to a method of fabricating a solar cell. More particularly, this invention relates to a method of fabricating a differential doped solar cell.

BACKGROUND OF THE INVENTION

The solar cell design in widespread use today has a p/n junction formed near the front surface (a surface which receives the light) which creates an electron flow as light energy is absorbed in the cell. A conventional cell design has one set of electrical contacts on the front side of the cell, and a second set of electrical contacts on the rear side of the solar cell. In a typical photovoltaic module these individual solar cells are interconnected electrically in series to increase the voltage.

This interconnection is typically accomplished by soldering a conductive ribbon from the front side of one solar cell to the rear side of an adjacent solar cell.

Therefore, the conventional solar cell adopts a p-type substrate and forms a thin n-type semiconductor layer on the p-type substrate. Before the diffusion process, a surface texturing is formed thereon and then an anti-reflection coating layer is coated to reduce the reflection of the light. Subsequently, a screen printing process is conducted to apply the silver (Ag) paste and the alumina (Al) paste on the surfaces of the wafer by a screen printing technology. After that a fire process is conducted in a high temperature oven to sinter the Al and Ag on the wafer surfaces to form the Al—Si alloy and the Ag—Si alloy on the respective surfaces of the wafer with the ohmic contact. Therefore, the conductive electrodes are formed on the surfaces of the wafer and the conventional solar cell is achieved.

However, while forming the conductive electrodes of the solar cell, a high doping concentration is required to reduce the contact resist on the conductive area. On the contrary, on the emitter area, the doping concentration has to be limited to improve the short wave frequency response for the solar cell. There is a need to balance or choose the doping concentration on the two areas of the solar cell to improve the energy conversion efficiency for the solar cell.

SUMMARY OF THE INVENTION

One objective of the present invention is to provide a method of fabricating a differential doped solar cell to form a high doping concentration in the electrode area and a low doping concentration in the emitter area to improve the energy conversion efficiency of the solar cell.

To achieve these and other advantages and in accordance with the objective of the present invention, as the embodiment broadly describes herein, the present invention provides a method of fabricating a differential doped solar cell. First, a substrate is provided. A doped layer having a heavily doped portion and a lightly doped portion under the heavily doped portion is formed on the substrate. The heavily doped portion of the doped layer is partially or fully removed. An anti-reflection coating layer is subsequently formed on the substrate, and a patterned metal conducting paste is formed on the anti-reflection coating layer. After that, the patterned metal conducting paste is fired to form metal electrodes for a solar cell.

An aspect of the present invention is to provide a method of fabricating a differential doped solar cell including the following steps: providing a substrate; forming a doped layer having a heavily doped portion and a lightly doped portion under the heavily doped portion; forming a patterned etching resist layer; acting the etching resist layer as a mask to remove an exposed portion of the heavily doped portion of the doped layer; removing the etching resist layer; forming an anti-reflection coating layer; forming a patterned metal conducting paste on the anti-reflection coating layer; and firing the metal conducting paste to form metal electrodes of a solar cell.

In addition, the step of forming a patterned etching resist layer further includes applying an etching paste on an etching resist layer and firing the etching paste to form the patterned etching resist layer. It is worth noting that the metal conducting paste is formed above residual portions of the heavily doped portion of the doped layer. The etching resist layer is made of silicon nitride or silicon oxide.

Another aspect of the present invention is to provide a method of fabricating a differential doped solar cell including the following steps: providing a substrate; forming a doped layer having a heavily doped portion and a lightly doped portion under the heavily doped portion; removing the heavily doped portion of the doped layer; forming a patterned diffusion barrier layer; acting the patterned diffusion barrier layer as a mask to dope an exposed portion of the lightly doped portion of the doped layer to form a heavily doped area; removing the patterned diffusion barrier layer; forming an anti-reflection coating layer; forming a metal conducting paste on the anti-reflection coating layer; and firing the metal conducting paste to form metal electrodes of a solar cell.

The patterned diffusion barrier layer preferably includes the steps of applying an etching paste on a diffusion barrier layer and firing the etching paste to form the patterned diffusion barrier layer. In addition, the patterned metal conducting paste is formed above the heavily doped area.

Furthermore, a sheet resistance of the heavily doped portion is about 10-50 Ohm/sq. and a sheet resistance of the lightly doped portion is higher than 50 Ohm/sq. The substrate is a p-type substrate and the doped layer is an n-type doped layer, for example, a phosphorus ion doped layer.

Therefore, the method of fabricating a differential doped solar cell according to the present invention only needs a single time of applying the etching paste to pattern the resist layer to form desired heavily doped area and lightly doped area on the substrate of the solar cell. Accordingly, the present invention can form a heavily doped area at the desired position for the metal electrodes to effectively reduce the contact resistance thereof and a lightly doped area on the emitter region of the solar cell to effectively improve the short wave frequency response for the solar cell. The heavily doped area can be formed by one or two times doping processes without departing from the spirit and scope of the present invention.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

FIGS. 1A to 1H illustrate a preferred embodiment of a method of fabricating a differential doped solar cell according to the present invention. First, refer to FIG. 1A. To manufacture a solar cell differential doped solar cell, a substrate 110 is first doped with ions, for example, phosphorus ions. Since the dopants enter the substrate 110 from the surface of the substrate 110, a heavily doped portion 112 is formed on the surface of the substrate 110 and a lightly doped portion 111 is therefore formed underneath the heavily doped portion 112. In a preferred embodiment, the substrate 110 is a p-type substrate and an n-type semiconductor layer is formed thereon through an ion doping process or a high temperature diffusion process. In addition, the doping concentration in the lightly doped portion 111 is lower than the doping concentration in the heavily doped portion 112. In a preferred embodiment, the sheet resistance of the heavily doped portion 112 is about 10-50 Ohm/sq., and the sheet resistance of the lightly doped portion 111 is higher than 50 Ohm/sq. When the doping concentration of the lightly doped portion 111 is lower than the doping concentration of the heavily doped portion 112, a higher energy conversion efficiency of the solar cell and a lower contact resistance for the conductive electrodes of the solar cell can be achieved. Subsequently, an etching resist layer 120 is formed on the heavily doped portion 112. In a preferred embodiment, the etching resist layer 120 can be made of silicon nitride, silicon oxide and so on.

Figure 1A:
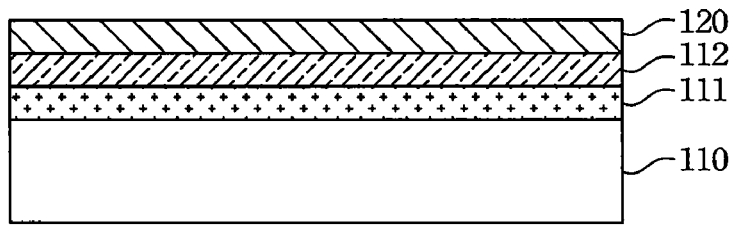
FIGS. 1A to 1H illustrate a preferred embodiment of a method of fabricating a differential doped solar cell according to the present invention.
Figure 1B:
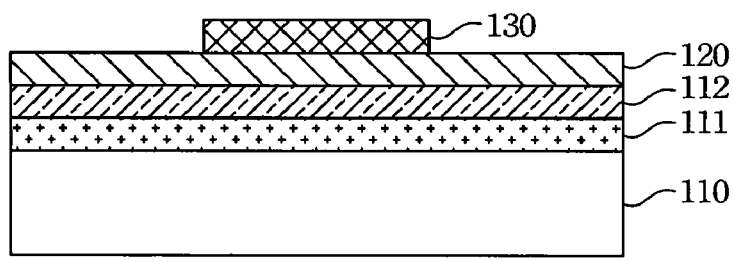
Figure 1C:
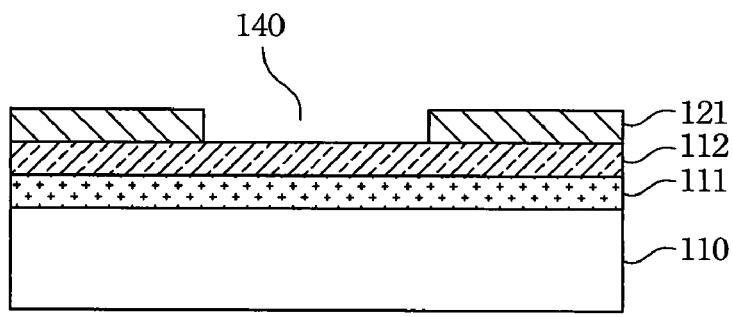
Figure 1D:
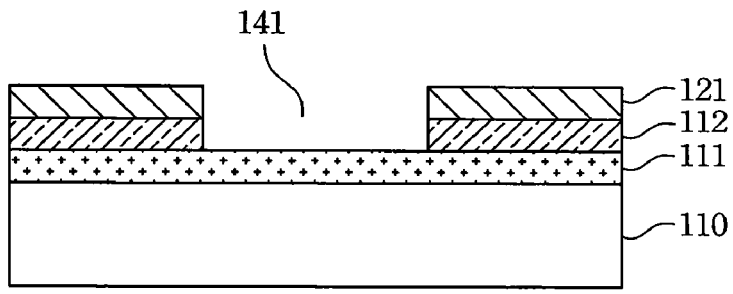

Further refer to FIG. 1B. An etching paste 130 is printed on the etching resist layer 120 in a screen printing process. Afterward the etching paste 130 is heated to form an opening 140 in the etching resist layer 120 so as to form a patterned etching resist layer 121, referring to FIG. 1C. Alternatively, the etching resist layer 120 can be patterned through a photolithograph process.

In addition, the patterned etching resist layer 121 acts as a mask to further etch the heavily doped portion 112 of the substrate 110, for example, using a wet etching process or a dry etching process to remove a part of the heavily doped portion 112 and form the opening 141 in the heavily doped portion 112 so as to expose the lightly doped portion 111.

Figure 1E:
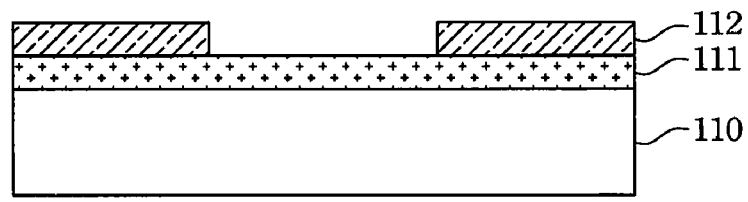
Figure 1F:
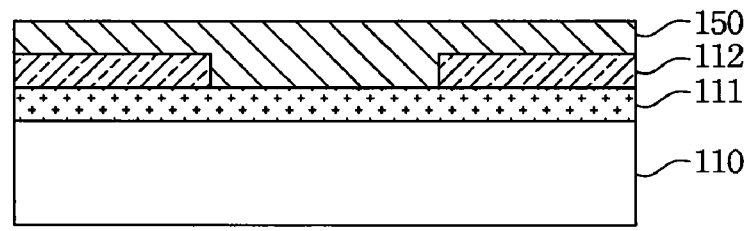

From FIGS. 1E to 1F, the patterned etching resist layer 121 is removed and an anti-reflection coating layer 150 is then formed on the substrate 110, that is, on the residual part of the heavily doped portion 112 and the exposed lightly doped portion 111.

Figure 1G:
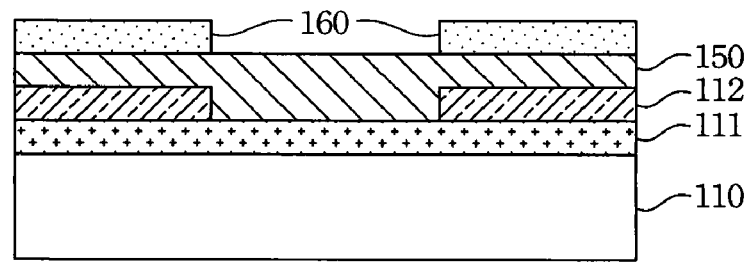
Figure 1H:
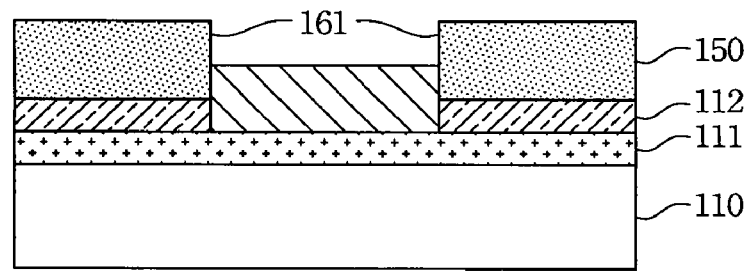

From the FIGS. 1G to 1H, a metal paste 160, for example, a silver paste or an aluminum paste is formed on the anti-reflection coating layer 150 through the screen printing process. The metal paste 160 is then fired at high temperature to etch through the anti-reflection coating layer 150 and form a eutectic structure with the heavily doped portion 112 so as to form metal electrodes 161 for the solar cell.

Accordingly, this preferred embodiment of the present invention can form a heavily doped portion at the desired position for the metal electrodes to effectively reduce the contact resistance thereof and a lightly doped layer on the emitter region of the solar cell to effectively improve the short wave frequency response for the solar cell.

Referring FIGS. 2A to 2H, another preferred embodiment of a method of fabricating a differential doped solar cell according to the present invention is illustrated. First, a substrate 210 for a solar cell is doped with ions, for example, phosphorus ions. Since the dopants enter the substrate 210 from the surface of the substrate 210, a heavily doped portion 212 is formed on the surface of the substrate 210 and a lightly doped portion 211 is therefore formed underneath the heavily doped portion 212. Similarly, the substrate 210 is preferably a p-type substrate and an n-type semiconductor layer is formed thereon through the ion doping process or the high temperature diffusion process. In addition, the doping concentration in the lightly doped portion 211 is lower than the doping concentration in the heavily doped portion 212. In a preferred embodiment, the sheet resistance of the heavily doped portion 212 is about 10-50 Ohm/sq., and the sheet resistance of the lightly doped portion 211 is higher than 50 Ohm/sq. However, when the doping concentration of the lightly doped portion 211 is lower than the doping concentration of the heavily doped portion 212, a higher energy conversion efficiency of the solar cell and a lower contact resistance for the metal electrodes of the solar cell can be achieved. Subsequently, the heavily doped portion 212 is removed, for example, by etching back process or any other removing process, and the lightly doped portion 211 is still kept.

Figure 2A:
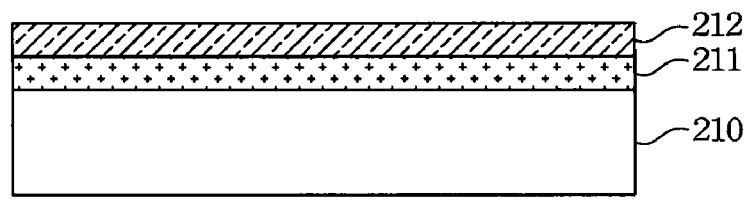
FIGS. 2A to 2H illustrate another preferred embodiment of a method of fabricating a differential doped solar cell according to the present invention.
Figure 2B:
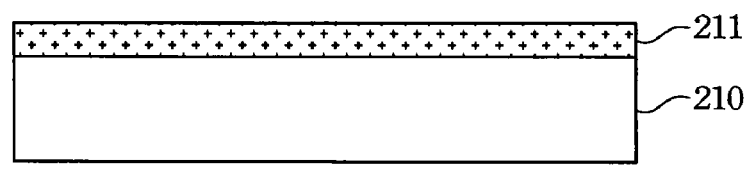
Figure 2C:
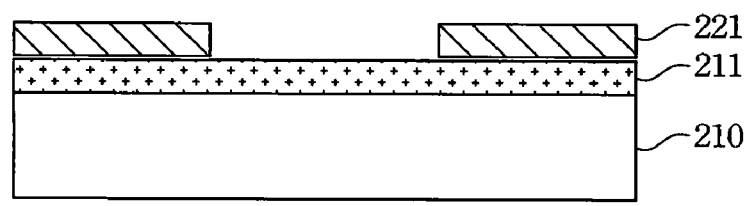

Referring to FIG. 2C, a patterned diffusion barrier layer 221 is formed. The patterned diffusion barrier layer 221 can be formed by the etching paste as shown in FIG. 1B. Alternatively, the patterned diffusion barrier layer 221 can be formed through a photolithograph process.

Figure 2D:
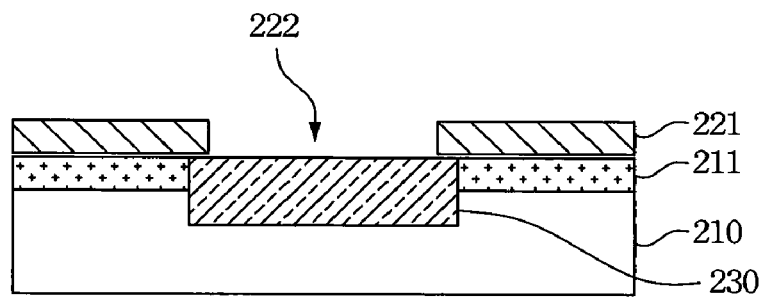
Figure 2E:
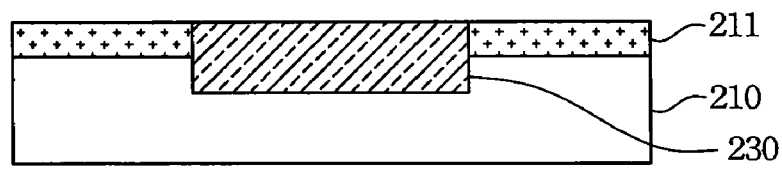
Figure 2F:
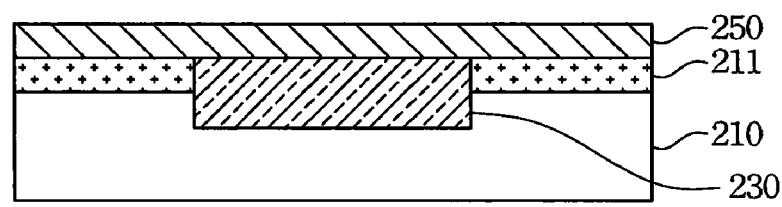

In FIG. 2D, a second doping process is conducted to further dope the substrate 210 and the lightly doped portion 211 under the opening 222 so as to form a heavily doped area 230 therein. In FIG. 2E, the patterned diffusion barrier layer 221 is removed. Subsequently, an anti-reflection coating layer 250 is formed thereon, in FIG. 2F.

Figure 2G:
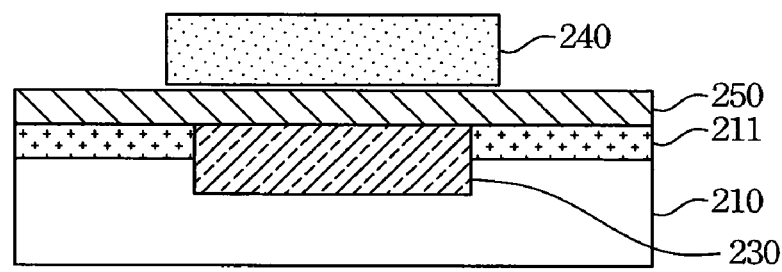
Figure 2H:
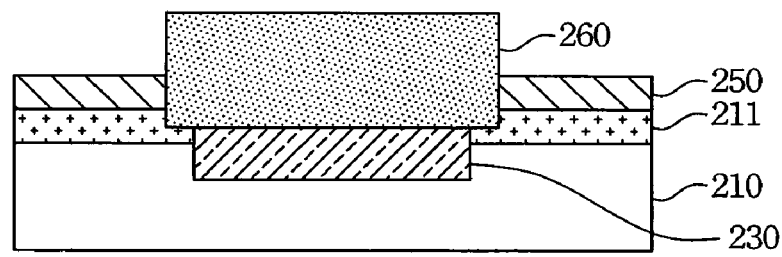

Refer to FIG. 2G. A metal paste 240, for example, a silver paste or an aluminum paste, is formed on the anti-reflection coating layer 250 and positioned above the heavily doped area 230 through the screen printing process. Refer to FIG. 2H. The metal paste 240 is then fired at high temperature to etch through the anti-reflection coating layer 250 and form a eutectic structure with the heavily doped area 230 so as to form metal electrodes 260 for the solar cell.

This preferred embodiment of the present invention uses two times doping processes to form a heavily doped area at the desired position for the metal electrodes to effectively reduce the contact resistance thereof and a lightly doped area on the emitter region of the solar cell to effectively improve the short wave frequency response for the solar cell. In addition, the two times doping process use only one time etching paste process or photolithograph process to form the metal electrodes for the solar cell so that the etching paste process or the photolithograph process can be saved in the two times doping process and the energy conversion efficiency of the solar cell is also improved.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A method of fabricating a differential doped solar cell, comprising:
   providing a substrate;
   forming a doped layer having a heavily doped portion and a lightly doped portion under the heavily doped portion;
   forming a patterned etching resist layer;
   using the etching resist layer as a mask to remove an exposed portion of the heavily doped portion of the doped layer;
   removing the etching resist layer;
   forming an anti-reflection coating layer;
   forming a patterned metal conducting paste on the anti-reflection coating layer; and
   firing the metal conducting paste to form metal electrodes of a solar cell.

2. The method of fabricating a differential doped solar cell of claim 1, wherein the step of forming a patterned etching resist layer further comprises:
   applying an etching paste on an etching resist layer; and
   firing the etching paste to form the patterned etching resist layer.

3. The method of fabricating a differential doped solar cell of claim 1, wherein the step of forming a patterned metal conducting paste on the anti-reflection coating layer is forming the metal conducting paste above residual portions of the heavily doped portion of the doped layer.

4. The method of fabricating a differential doped solar cell of claim 1, wherein the doped layer is doped by phosphorus ions.

5. The method of fabricating a differential doped solar cell of claim 1, wherein a sheet resistance of the heavily doped portion is about 10-50 Ohm/sq.

6. The method of fabricating a differential doped solar cell of claim 5, wherein a sheet resistance of the lightly doped portion is higher than 50 Ohm/sq.

7. The method of fabricating a differential doped solar cell of claim 1, wherein the substrate is a p-type substrate.

8. The method of fabricating a differential doped solar cell of claim 7, wherein the doped layer is an n-type doped layer.

9. The method of fabricating a differential doped solar cell of claim 1, wherein the etching resist layer is made of silicon nitride or silicon oxide.

10. A method of fabricating a differential doped solar cell, comprising:
    providing a substrate;
    forming a doped layer having a heavily doped portion and a lightly doped portion under the heavily doped portion;
    removing the heavily doped portion of the doped layer;
    forming a patterned diffusion barrier layer;
    using the patterned diffusion barrier layer as a mask to dope an exposed portion of the lightly doped portion of the doped layer to form a heavily doped area;
    removing the patterned diffusion barrier layer;
    forming an anti-reflection coating layer;
    forming a metal conducting paste on the anti-reflection coating layer; and
    firing the metal conducting paste to form metal electrodes of a solar cell.

11. The method of fabricating a differential doped solar cell of claim 10, wherein the step of forming a patterned diffusion barrier layer further comprises:
    applying an etching paste on a diffusion barrier layer; and
    firing the etching paste to form the patterned diffusion barrier layer.

12. The method of fabricating a differential doped solar cell of claim 10, wherein the step of forming a patterned metal conducting paste on the anti-reflection coating layer is forming the metal conducting paste above the heavily doped area.

13. The method of fabricating a differential doped solar cell of claim 10, wherein a sheet resistance of the heavily doped portion is about 10-50 Ohm/sq. and a sheet resistance of the lightly doped portion is higher than 50 Ohm/sq.

14. The method of fabricating a differential doped solar cell of claim 10, wherein the substrate is a p-type substrate and the doped layer is an n-type doped layer.

* * * * *